US011646567B2

(12) United States Patent
Zhou et al.

(10) Patent No.: US 11,646,567 B2
(45) Date of Patent: *May 9, 2023

(54) SOLID STATE CIRCUIT INTERRUPTER

(71) Applicant: EATON INTELLIGENT POWER LIMITED, Dublin (IE)

(72) Inventors: Xin Zhou, Wexford, PA (US); Brian E. Carlson, Gibsonia, PA (US); Yanjun Feng, Los Angeles, CA (US); Jianyang Liu, Lake Forest, CA (US); Michael Slepian, Murrysville, PA (US); Andrew L. Gottschalk, Monaca, PA (US); Santosh Kumar Chamarajanagar Govinda Nayaka, Moon Township, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 17/516,941

(22) Filed: Nov. 2, 2021

(65) Prior Publication Data
US 2022/0060013 A1 Feb. 24, 2022

Related U.S. Application Data

(63) Continuation of application No. 16/775,976, filed on Jan. 29, 2020, now Pat. No. 11,239,649.

(51) Int. Cl.
*H02H 3/093* (2006.01)
*H02H 3/00* (2006.01)
*G01R 15/14* (2006.01)

(52) U.S. Cl.
CPC ........... *H02H 3/0935* (2013.01); *G01R 15/14* (2013.01); *H02H 3/006* (2013.01)

(58) Field of Classification Search
CPC .............................. H02H 3/0935; H02H 3/006
See application file for complete search history.

(56) References Cited

U.S. PATENT DOCUMENTS 5,646,833 A 7/1997 Gaudreau et al.
2012/0320486 A1 12/2012 Lagree et al.
(Continued)

FOREIGN PATENT DOCUMENTS

CN 202 310 434 U 7/2012
CN 109 600 975 A 4/2019

OTHER PUBLICATIONS

European Patent Office "International Search Report and Written Opinion", from corresponding International Application No. PCT/EP21/025034, dated Jul. 28, 2022, 9 pp.
(Continued)

*Primary Examiner* — Sisay G Tiku
(74) *Attorney, Agent, or Firm* — Eckert Seamans Cherin & Mellott LLC

(57) ABSTRACT

A circuit interrupter including a current sensor having a normal sensor output and an over current detection output, a solid state switch module structured to have a closed state to allow current to flow through the circuit interrupter and an open state to interrupt current flowing through the circuit interrupter, a gate driver structured to control the solid state switch module including a desaturation function output, wherein the gate driver is structured to cause the solid state switch module to interrupt current flowing through the circuit interrupter when the DESAT function output changes to the on state, and an electronic trip circuit structured to output a trip signal to the gate driver when the normal sensor output reaches a first threshold level or the overcurrent detection output changes to the on state.

18 Claims, 18 Drawing Sheets

(56) References Cited

U.S. PATENT DOCUMENTS

2016/0203932 A1   7/2016 Niehoff
2021/0351770 A1*  11/2021 Liu ......................... H03K 5/01
2022/0271745 A1*  8/2022 Culpin ............... H03K 17/0822

OTHER PUBLICATIONS

European Patent Office "International Search Report and Written Opinion", from corresponding International Application No. PCT/EP21/025033, dated Jul. 28, 2022, 10 pp.

* cited by examiner

SOLID STATE CIRCUIT INTERRUPTER

CROSS-REFERENCE TO RELATED APPLICATIONS

This application is a continuation of, and claims priority under 35 U.S.C. § 120 from, U.S. patent application Ser. No. 16/775,976, filed Jan. 29, 2020, entitled "SOLID STATE CIRCUIT INTERRUPTER", the contents of which are incorporated herein by reference.

This application is related to commonly assigned U.S. patent application Ser. No. 16/775,985, filed Jan. 29, 2020, and entitled "SOLID STATE CIRCUIT INTERRUPTER".

BACKGROUND

Field

The disclosed concept relates generally to circuit interrupters, and in particular, to solid state circuit interrupters.

Background Information

Circuit interrupters, such as for example and without limitation, circuit breakers, are typically used to protect electrical circuitry from damage due to an overcurrent condition, such as an overload condition, a short circuit, or another fault condition, such as an arc fault or a ground fault. Solid state circuit interrupters use solid state components, e.g., semiconductor devices, to switch on and off current flowing from a power source to a load.

Solid state circuit interrupters provide faster tripping than conventional mechanical circuit interrupters. However, these capabilities have not been optimally utilized. Additionally, solid state circuit interrupters provide different safety and wellness concerns than conventional mechanical circuit interrupters. There is considerable room for improvement in solid state circuit interrupters.

SUMMARY

In accordance with an aspect of the disclosed concept, a circuit interrupter structured to electrically connect between a power source and a load comprises: a current sensor structured to sense current flowing through the circuit interrupter and having a normal sensor output proportional to the current flowing through the circuit interrupter and an over current detection (OCD) output that changes to an on state when the current flowing through the circuit interrupter reaches a second threshold level; a solid state switch module structured to have a closed state to allow current to flow through the circuit interrupter and an open state to interrupt current flowing through the circuit interrupter; a gate driver structured to control the solid state switch module to interrupt current flowing through the circuit interrupter, wherein the gate driver includes a desaturation (DESAT) function output that changes to an on state when the current flowing through the circuit interrupter reaches a third threshold level, and wherein the gate driver is structured to cause the solid state switch module to interrupt current flowing through the circuit interrupter when the DESAT function output changes to the on state; and an analog trip circuit structured to receive the normal sensor output and the OCD output and to output a trip signal to the gate driver when the normal sensor output reaches a first threshold level or the OCD output changes to the on state, wherein the trip signal causes the gate driver to control the solid state switch module to interrupt current flowing through the circuit interrupter.

In accordance with an aspect of the disclosed concept, a circuit interrupter structured to electrically connect between a power source and a load comprises: separable contacts structured to open to provide galvanic isolation between the power source and the load; an operating mechanism structured to open and close the separable contacts; a first position sensor structured to sense a position of the separable contacts; a solid state switch module structured to have a closed state to allow current to flow through the circuit interrupter and an open state to interrupt current flowing through the circuit interrupter; and an electronic trip unit structured to control the solid state switch module to change between the open state and the closed state and to control the operating mechanism to open the separable contacts, wherein, based on an output of the first position sensor, the electronic trip unit is structured to control the solid state switch module to control the solid state switch module to change from the open state to the closed state when the separable contacts are in a closed position.

In accordance with an aspect of the disclosed concept, a solid state switch assembly for use in a circuit interrupter comprises: an input terminal; a first conductor; an output terminal; a second conductor; a solid state switch module electrically connected to the input terminal with the first conductor and electrically connected to the output terminal with the second conductor and including at least one solid state switch; a heat sink attached to the solid state switch module; a current sensor structured to sense current flowing through the solid state switch module; and a number of metal oxide varistors (MOVs).

In accordance with an aspect of the disclosed concept, a circuit interrupter comprises: a frame including a number of compartments; and a number of solid state switch assemblies, each solid state switch assembly disposed in a corresponding one of the number of compartments and including: an input terminal; a first conductor; an output terminal; a second conductor; a solid state switch module electrically connected to the input terminal with the first conductor and electrically connected to the output terminal with the second conductor and including at least one solid state switch; a heat sink; a current sensor structured to sense current flowing through the solid state; and a number of metal oxide varistors (MOVs).

In accordance with an aspect of the disclosed concept, a method of operating a circuit interrupter having a solid state switch module including a solid state switch comprises: monitoring a characteristic of the solid state switch; determining that the characteristic of the solid state switch meets or exceeds a predetermined threshold; and providing an indication in response to determining that the characteristic of the solid state switch meets or exceeds the predetermined threshold.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
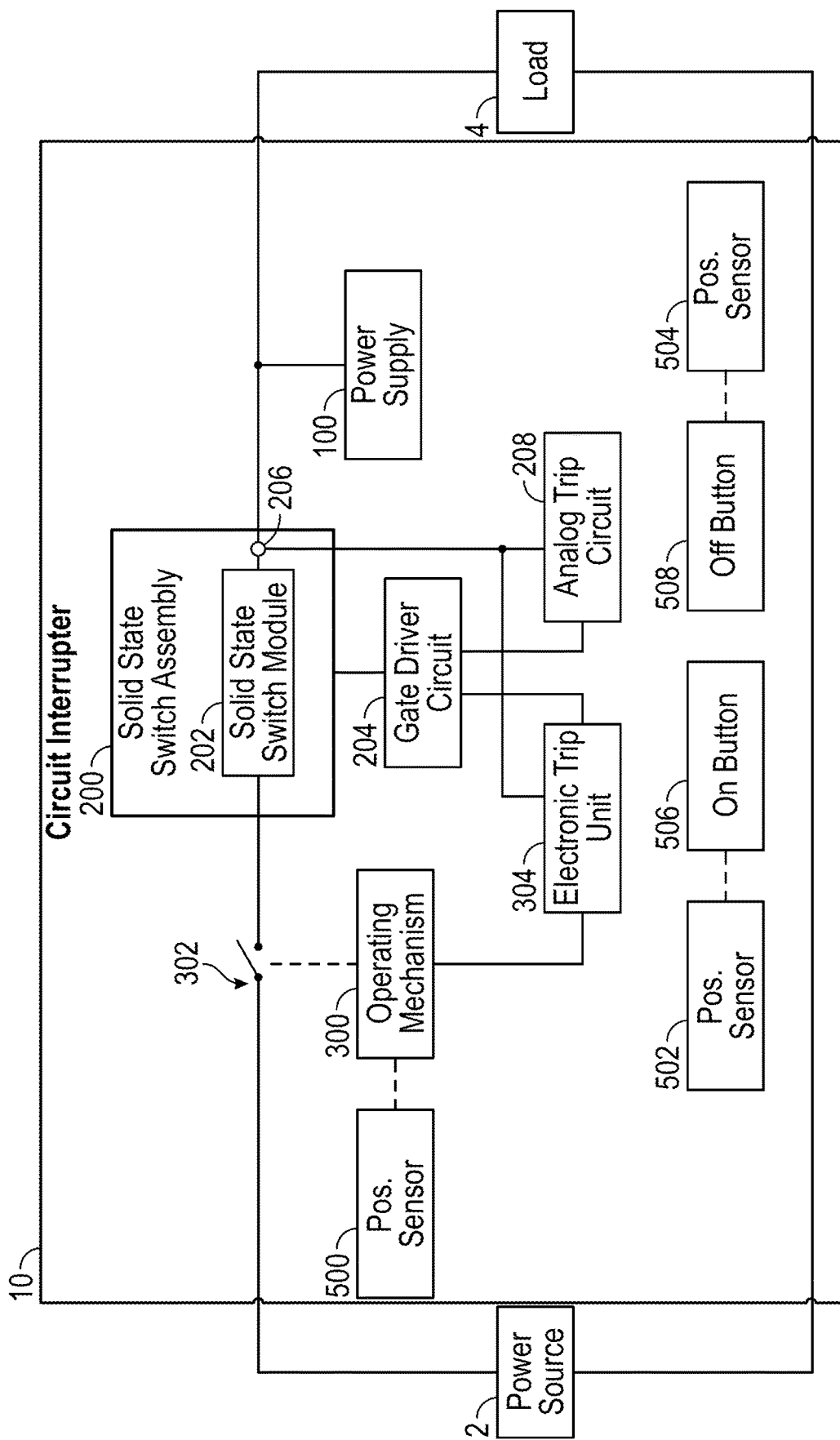
FIG. 1 is a schematic diagram of a circuit interrupter in accordance with an example embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

FIG. 1 is a schematic diagram of a circuit interrupter 10 (e.g., without limitation, a circuit breaker) in accordance with an example embodiment of the disclosed concept. The circuit interrupter 10 in some example embodiments is a 100 A ($I_n$=100 A) rated device (i.e., the rated current $I_n$ is 100 A). The circuit interrupter 10 is structured to be electrically connected between a power source 2 and a load 4. The circuit interrupter 10 is structured to trip open or switch open to interrupt current flowing to the load 4, for example, in the case of a fault condition (e.g., without limitation, an overcurrent condition) to protect the load 4, circuitry associated with the load 4, as well as the components within the circuit interrupter 10.

The circuit interrupter 10 includes a solid state switch assembly 200 including a solid state switch module 202 and a current sensor 206. The circuit interrupter 10 also includes a gate driver circuit 204 and an analog trip circuit 208 associated with the solid state switch assembly 200. The circuit interrupter 10 further includes an operating mechanism 300, separable contacts 302, and an electronic trip unit 304, as well as a power supply 100. Additionally, the circuit interrupter 10 includes positon sensors 500, 502, 504, and close and open buttons 506,508. It will be appreciated by those having ordinary skill in the art that the circuit interrupter 10 need not include all these components. For example, in example embodiments, the circuit interrupter 10 may only include a subset of these components without departing from the scope of the disclosed concept.

The circuit interrupter 10 is structured to provide solid state circuit interruption via the solid state switch assembly 200 and galvanic isolation via the separable contacts 302. The solid state switch module 202 includes one or more solid state switches (e.g., without limitation, metal-oxide-semiconductor field-effect transistors (MOSFETS), insulated-gate bipolar transistors (IGBTs), or other suitable types of solid state switches) electrically connected between the power source 2 and the load 4. The solid state switch module 202 has a closed state in which power is allowed to flow through the solid state switch module 202 between the power source 2 and the load 4 and an open state in which power is prevented from flowing between the power source 2 and the load 4.

The gate driver circuit 204 is structured to control the state of the solid state switch module 202. The gate driver circuit 204 has a desaturation function (DESAT) that changes from an off state to an on state when current flowing through the solid state switch module 202 reaches a predetermined threshold level. In an example embodiment, the predetermined threshold level is about 2250 A (22.5×$I_n$). The DESAT function operates by monitoring a forward voltage drop of a solid state switch in the solid state switch module 202. When the forward voltage drop reaches a threshold level, the DESAT function changes to the on state and the gate driver circuit 204 responsively causes the solid state switch module 202 to change to the open state, interrupting current flowing through the circuit interrupter 10. In an example embodiment, the DESAT function has a threshold voltage of 9V. Based on the on-resistance of a silicon-carbide (SiC) MOSFET, the forward voltage drop will reach 9V when the current level is about 2250 A. Thus, the DESAT function will change to the on state when the current flowing through the solid state switch module 202 reaches about 2250 A. It will be appreciated that these threshold values are merely provided as an example. Different threshold values may be employed without departing from the scope of the disclosed concept.

Using the DESAT function of the gate driver circuit 204 to cause the solid state switch module 202 to open allows for very fast interruption of the current flowing through the circuit interrupter 10. In some example embodiments of the disclosed concept, interruption based on the DESAT function can be within 0.5 microseconds. In some example embodiments of the disclosed concept, the gate driver circuit 204 includes a capacitor structured to change the interruption based on the DESAT function. For example, the time to interrupt based on the DESAT function is based on the capacitance of the capacitor. In this manner, the interruption time based on the DESAT function can be easily adjusted by changing the capacitor.

In some example embodiments, the current sensor 206 is structured to provide a normal sensor output that is proportional to the current flowing through the circuit interrupter 10 and an overcurrent detection (OCD) output that changes to an on state when the current flowing through the circuit interrupter 10 reaches a threshold level. In an example embodiment, the current sensor 206 is a Hall-effect sensor.

The analog trip circuit 208 is structured to receive the normal sensor output and the OCD output from the current sensor 206. The analog circuit 208 is electrically connected to the gate driver circuit 204 and is structured to output a trip signal to the gate driver circuit 204. In response to the trip signal, the gate driver circuit 204 controls the solid state switch module 202 to change to the open state, interrupting current flowing through the circuit interrupter 10. The analog trip circuit 208 is structured to output the trip signal in response to the normal sensor output reaching a threshold level or the OCD output changing to the on state. The analog trip circuit 208 is structured to output the trip signal in response to the OCD output changing to the on state within a first predetermined amount of time and to output the trip signal in response to the normal sensor output reaching the threshold level within a second predetermined amount of time. In an example embodiment, the first predetermined amount of time is less than the second predetermined amount of time. In an example embodiment, the first predetermined amount of time is 10 nanoseconds and the second predetermined amount of time is 100 nanoseconds. However, it will be appreciated that other predetermined amounts of time may be employed without departing from the scope of the disclosed concept. In an example embodiment, interruption of current flowing through the circuit interrupter 10 based on the normal sensor output reaching the threshold level occurs within 4 microseconds and interruption based on the OCD output occurs within 2 microseconds. However, it will be appreciated that these are example times and other times may be employed without departing from the scope of the disclosed concept. In some example embodiments, the threshold level associated with the normal current sensor output is within a range of about 200 ($2 \times I_n$) to 750 A ($7.5 \times I_n$) and the threshold level associated with the OCD output is about 750 A ($7.5 \times I_n$). However, it will be appreciated that these are just example values and may be adjusted without departing from the scope of the disclosed concept.

With the analog trip circuit 208 and the DESAT function of the gate driver circuit 204, a three-level interruption logic is able to be employed within the circuit interrupter 10. The DESAT function provides the fastest interruption based on the highest current threshold, the OCD output provides the second fastest interruption based on the second highest current threshold, and the normal sensor output provides the third fastest interruption based on the third highest current threshold. In an example embodiment, the highest current threshold is about 2250 A ($22.5 \times I_n$) and the fastest interruption is within 0.5 microseconds, the second highest current threshold is about 750 A ($7.5 \times I_n$) and the second fastest interruption is within 2.5 microseconds, and the third highest current threshold is selected from within a range of about 200 ($2 \times I_n$)-750 A ($7.5 \times I_n$) and the third fastest interruption is within 4 microseconds. With the analog trip circuit 208 and the DESAT function of the gate driver circuit 204, interruption is able to occur faster than through digital circuit protection, such as that provided by the electronic trip unit 304.

In some example embodiments of the disclosed concept, the electronic trip unit 304 is also structured to output a trip signal to the gate driver circuit 204 to cause the gate driver circuit 204 to control the solid state switch module 202 to change to the open state. The electronic trip unit 304 may output the trip signal based on current thresholds below the third highest current threshold associated with trips based on the normal sensor output by the analog trip circuit 208. The electronic trip unit 304 may be structured to output the trip signal based on an I-t trip curve such that when the electronic trip unit 304 detects a fault condition based on the normal sensor output of the current sensor 206, the electronic trip unit 304 will output the trip signal to the gate driver circuit 204 at the time associated with the current level based on the I-t trip curve.

The circuit interrupter 10 also includes the operating mechanism 300 and separable contacts 302. The separable contacts 302 are structured to open to provide galvanic isolation between the power source 2 and the load 4. The operating mechanism 300 is structured open and close the separable contacts 302. For example, the operating mechanism 300 may include a movable arm, which when moved causes the separable contacts 302 to open or close. The electronic trip unit 304 is structured to control the operating mechanism 300 to open the separable contacts 302. For example, the electronic trip unit 304 may be structured to control the operating mechanism 300 to open the separable contacts 302 only after the solid state switch module 202 has changed to the open state. For example, in a mechanical circuit interrupter, the separable contacts are designed to interrupt current flowing through the circuit interrupter and have associated components such as an arc chute to manage arcing as a result of circuit interruption. The circuit interrupter 10 is a solid state circuit interrupter in which current is interrupted by the solid state switch module 202. The separable contacts 302 need not be designed to interrupt the current and need not have an associated arc chute or other components, as they are only intended to open after the solid state switch module 202 has interrupted the current. As such, the electronic trip unit 304 may be structured to control the operating mechanism 300 to open the separable contacts 302 only after the solid state switch module 202 has changed to the open state. Similarly, the electronic trip unit 304 may be structured to cause the gate driver circuit 204 to change the solid state switch module 202 to the closed state only after the separable contacts 302 are closed. In this manner, bounce arc due to bouncing of the separable contacts 302 is prevented. In some example embodiments, the separable contacts 302 are closed with manual intervention by a user through, for example, a reset switch. In some example embodiments, the operating mechanism 300 is structured to close the separable contacts 302 in response to a close signal from the electronic trip unit 304.

In some example embodiments of the disclosed concept, the circuit interrupter 10 includes a position sensor 500. The position sensor 500 is structured to sense whether the separable contacts 302 are in the open position or the closed position. The output of the position sensor 500 may be provided to the electronic trip unit 304. Based on the output of the position sensor 500, the electronic trip unit 304 is able to determine the position of the separable contacts 302. Similarly, the electronic trip unit 304 unit may receive an output of the gate driver circuit 204 indicative of the state of the solid state switch module 202. With these outputs, the electronic trip unit 304 may ensure that the separable contacts 302 are opened only after the solid state switch module 202 has changed to the open state and that the solid state switch module 202 is changed to the closed state only after the separable contacts 302 are closed.

In some example embodiments, the circuit interrupter 10 includes a close button 506 and an open button 508. It will be appreciated that buttons are used as an example. It will be appreciated that any user actuatable element may be employed without departing from the scope of the disclosed concept. In an example embodiment, the electronic trip unit 304 is structured to control the operating mechanism 300 to close the separable contacts 302 to close and then output a close signal to the gate driver circuit 204 to cause the gate driver circuit 204 to change the solid state switch module 202 to the closed state in response to actuation of the close button 506. In an example embodiment, the electronic trip unit 304 is structured to output the trip signal to the gate driver circuit 204 to cause the gate driver circuit 204 to change the solid state switch module 202 to the open state and then control the operating mechanism 300 to open the separable contacts 302 in response to actuation of the open button 508. In some example embodiments, a position sensor 502 may be used to sense actuation of the close button 506 and a position sensor 504 may be used to sense actuation of the open button 508. The electronic trip unit 304 may be structured to receive outputs of the position sensors 502,504 and sense actuation of the close and open buttons 506,508 based on outputs of the position sensors 502,504.

The position sensors 500,502,504 may be any suitable type of sensor for sensing the position of a component. As an example, the position sensors 500,502,504 may be micro switches that are actuated by movement of their corresponding component. For example, the position sensor 500 may be a micro switch disposed by a movable arm of the operating mechanism 300 such that movement of the moveable arm to open or close the separable contacts 302 actuates the position sensor 500, and based on the output of the position sensor 500, the electronic trip unit 304 is able to sense the current position of the separable contacts 302. Similarly, the position sensors 502,504 may be micro switches disposed such that actuation of the on and off buttons 506,508, respectively, actuates the position sensors 502,504.

The power supply 100 is structured to receive power from the power source 2 and convert the power from the power source 2 to power usable by components of the circuit interrupter 10. For example, the power supply 100 may convert alternating current power from the power source 2 to direct current power usable by components of the circuit interrupter 10. The power from the power supply 100 may provide power to operate components such as, without limitation, the electronic trip unit 304, the gate driver circuit 204, the operating mechanism 300 (e.g., a solenoid included in the operating mechanism), the current sensor 206, and the analog trip circuit 208). The power supply 100 may generate direct current power at multiple voltages (e.g., without limitation, 24V, 15V, 5V, and 3.3V). In an example embodiment, the power supply 100 may be omitted and power to operate the components of the circuit interrupter 10 may be provided by an external power supply. In some example embodiments, the electronic trip unit 304 is structured to cause the solid state switch module 202 to change to the open state and the separable contacts 302 to open if power is unavailable from the power supply 100 or an external power supply. In some example embodiments, the power supply 100 is structured to use line-line voltage from the power source 2 to generate the direct current power for use by the components of the circuit interrupter 10. For example, rather than being connected between line and neutral conductors, the power supply 100 is instead connected between multiple line conductors. While FIG. 1 shows a single pole of the circuit interrupter 10, it will be appreciated that the circuit interrupter 10 may have multiple poles in which multiple line phases of power flow through the circuit interrupter 10 with the power supply 100 being connected to the multiple line phases.

Figure 2:
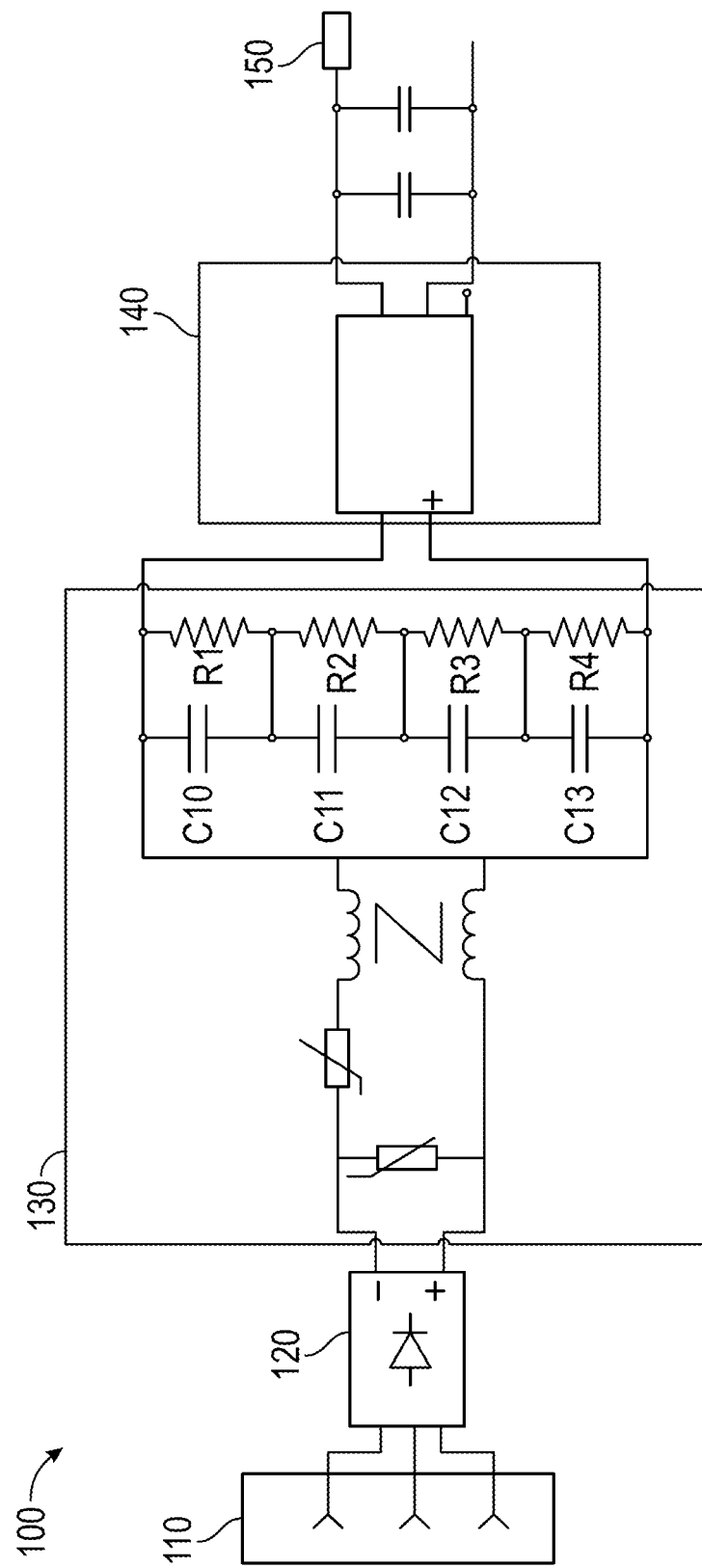
FIG. 2 is a circuit diagram of a power supply in accordance with an example embodiment of the disclosed concept.

FIG. 2 is a circuit diagram of the power supply 100 in accordance with an example embodiment of the disclosed concept. In this example embodiment, the power supply 100 includes a three-phase line input 110, a rectifier diode bridge 120, a filtering circuit 130, a DC/DC converter 140, and an output 150. The three-phase line input 110 receives power from multiple lines phases and provides a line-to-line AC voltage input to the rectifier diode bridge 120. The rectifier diode bridge 120 converts the AC voltage to DC voltage and outputs the DC voltage into the filtering circuit 130. The filtering circuit 130 limits the current input, thereby protecting the power supply circuit 100 from rushing in of the current input, and filters the DC voltage via the current dividers (C10, C11, C12, C13, R1, R2, R3, and R4). The DC/DC converter 140 receives the filtered DC voltage from the filtering circuit 130 and converts the filtered high DC voltage to low DC voltage, e.g., 24V, 15V, 5V, or 3.3V. The DC/DC converter 140 then outputs the low DC voltage to provide power for components of the circuit interrupter 10. The line voltage is stepped down to, e.g., 24, 15, 5, or 3.3V DC, to fulfill the voltage requirements of the electrical components of the circuit interrupter 10. When the line to line voltage is not available, an external 24V power supply may be used. If there is neither the external power nor the line to line voltage, the solid state switch module 202 may be changed to the open state. While FIG. 2 illustrates an example of circuitry used within the power supply 400, it will be appreciated that FIG. 2 is merely an example embodiment. Circuit components may be rearranged, added to, subtracted from, or implemented differently without departing from the scope of the disclosed concept.

Figure 3A:
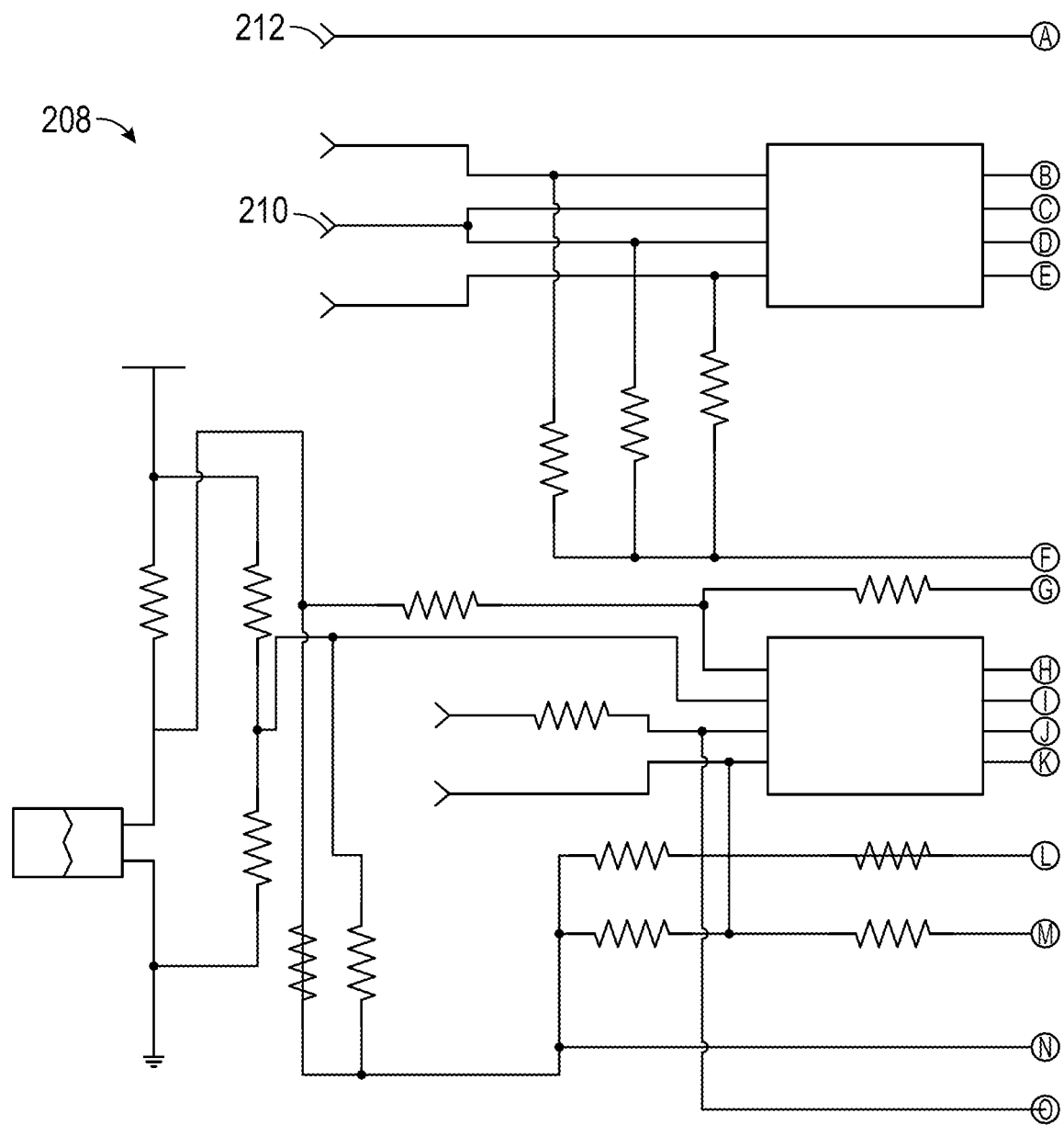
FIGS. 3A and 3B are a circuit diagram of an analog trip circuit in accordance with an example embodiment of the disclosed concept.
Figure 3B:
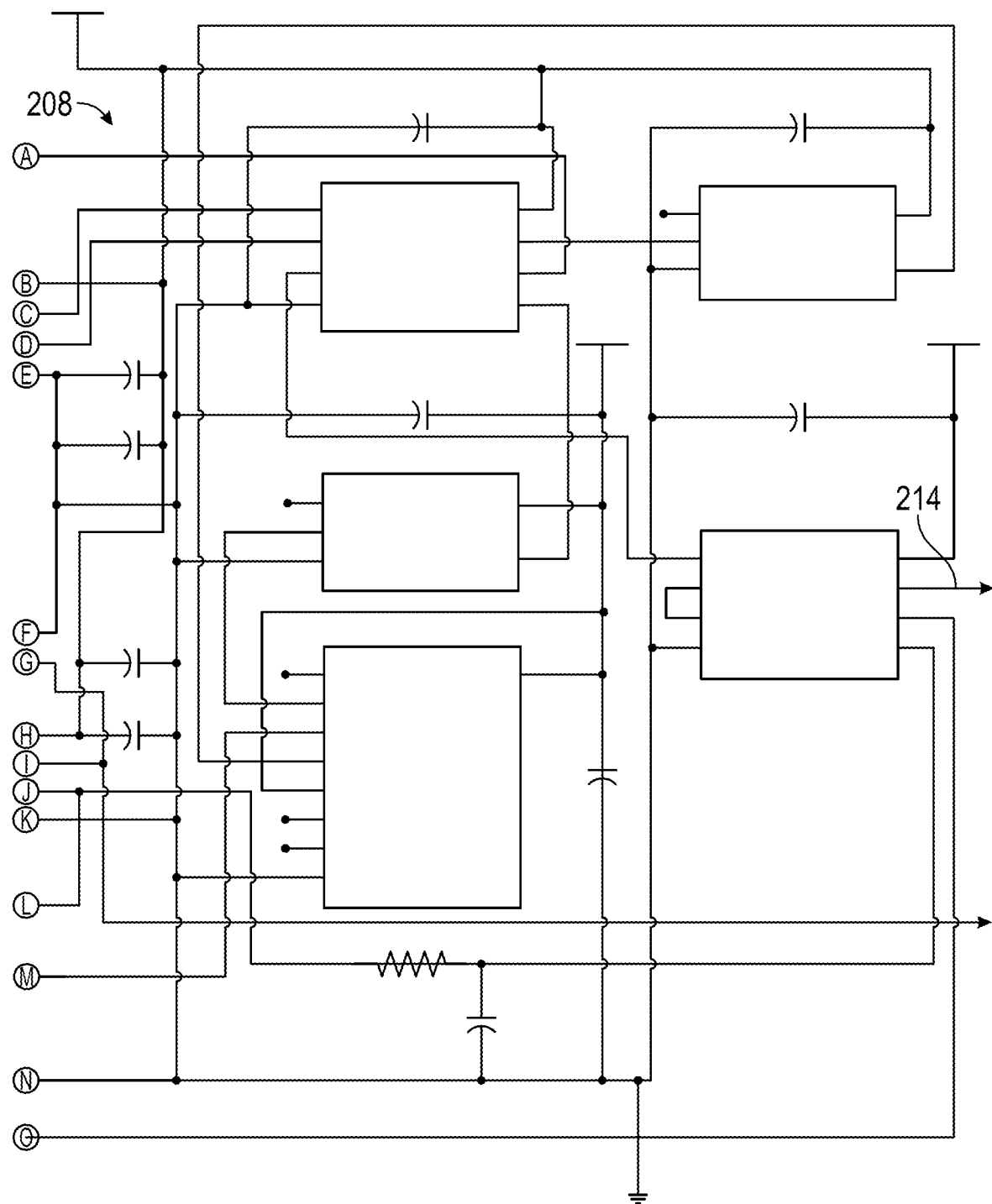

FIGS. 3A and 3B are a circuit diagram of the analog trip circuit 208 in accordance with an example embodiment of the disclosed concept. The analog trip circuit 208 includes a normal sensor input 210 and an OCD input 212. The normal sensor input 210 is structured to receive the normal sensor output of the current sensor 206, which is proportional to current flowing through the circuit interrupter 10. The OCD input 212 is structured to receive the OCD output of the current sensor 206. The analog trip circuit 208 also includes a trip signal output 214 that is electrically connected to the gate driver circuit 204. In response to the normal sensor output reaching a threshold level or the OCD output changing to an on state, the analog trip circuit 208 is structured to output the trip signal at the output 214. The analog trip circuit 208 is structured to compare the normal sensor output to the threshold level while the OCD output is not needed to be compared to the threshold level. By bypassing this check with the OCD output, the analog trip circuit 208 is able to output the trip signal based on the OCD output faster than the trip signal based on the normal sensor output. FIGS. 3A and 3B illustrates an example of logic circuitry used in the analog trip circuit 208. However, it will be appreciated that the example shown in FIGS. 3A and 3B is merely an example implementation of the analog trip circuit 208. It will be appreciated that the circuit components may be rearranged, added to, subtracted from, or implemented differently without departing from the scope of the disclosed concept.

Figure 4A:
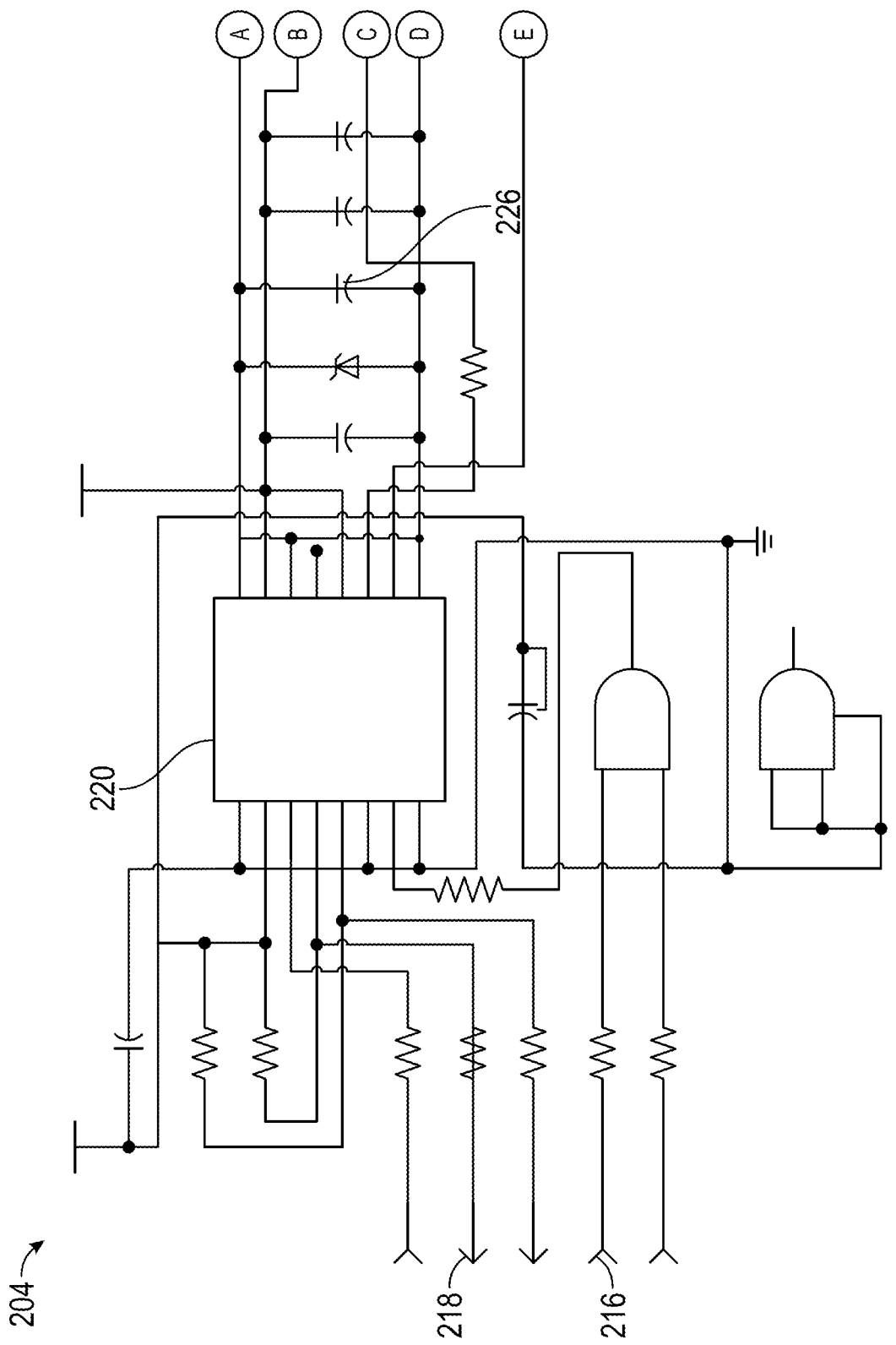
FIGS. 4A and 4B are a circuit diagram of a gate driver circuit in accordance with an example embodiment of the disclosed concept.
Figure 4B:
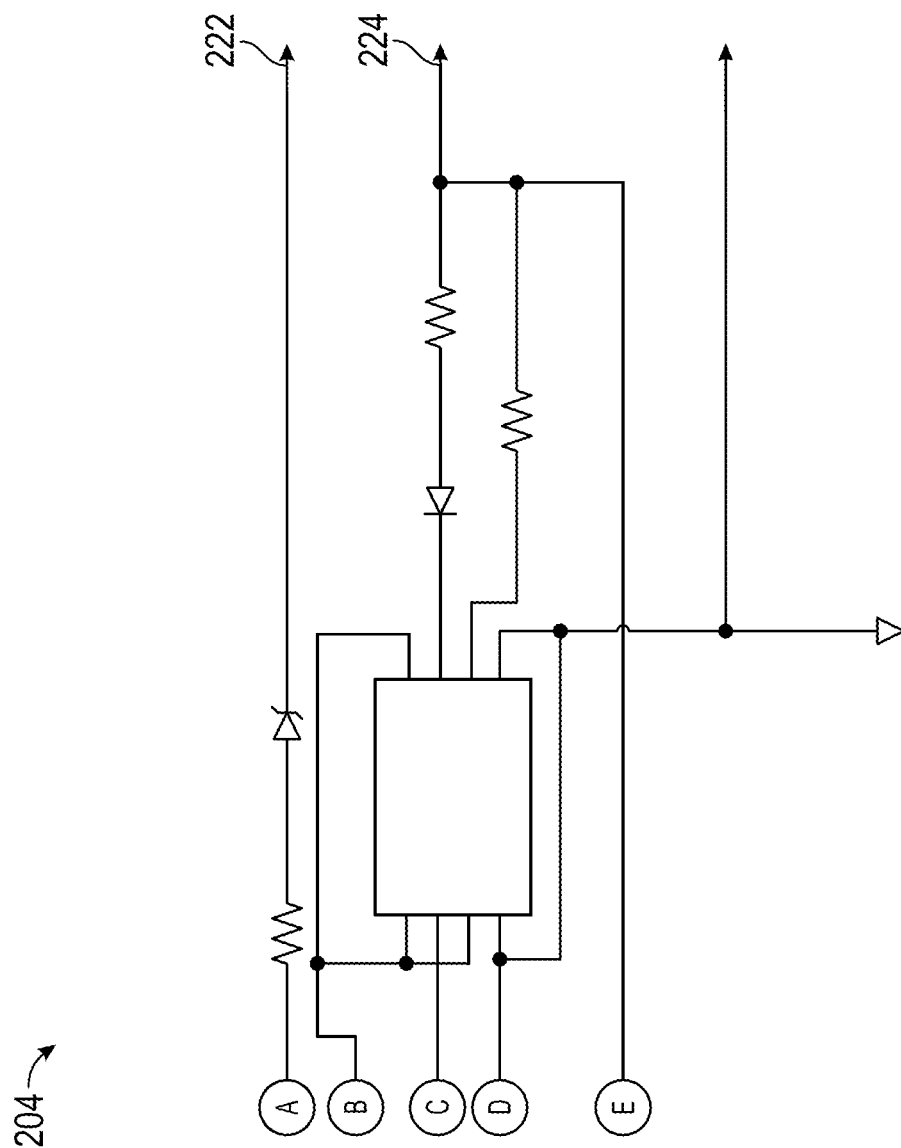

FIGS. 4A and 4B are a circuit diagram of the gate driver circuit 204 in accordance with an example embodiment of the disclosed concept. The gate driver circuit 204 includes an enable input 216 and a DESAT input 222. The gate driver circuit 204 also includes a driver output 224 and fault output 218. The gate driver circuit 204 further includes a driver 220 and a capacitor 226. The enable input 216 is electrically connected to the analog trip circuit 208 and the electronic trip unit 304. The driver output 224 and the DESAT input 222 are electrically connected to the solid state switch module 202. The fault output 218 is electrically connected to the electronic trip unit 218. The solid state switch module 202 is structured to change between the open state and the closed state based on the driver output 224. The driver 220 is structured to control the state of the driver output 224 based on the trip signal received at the enable input 216 or the DESAT input 222. The driver 220 is structured to implement the DESAT function based on the DESAT input 222. The timing associated with changing the driver output 224 based on the DESAT input 222 is based in part on the capacitance of the capacitor 226. The driver 220 is also structured to control the state of the fault output 218 such that the electronic trip unit 304 may be notified when the gate driver circuit 204 has controlled the solid state switch module 202 to change to the open or closed state. It will be appreciated that the example shown in FIGS. 4A and 4B is merely an example implementation of the gate driver circuit 204. It will be appreciated that the circuit components may be rearranged, added to, subtracted from, or implemented differently without departing from the scope of the disclosed concept.

Figure 5A:
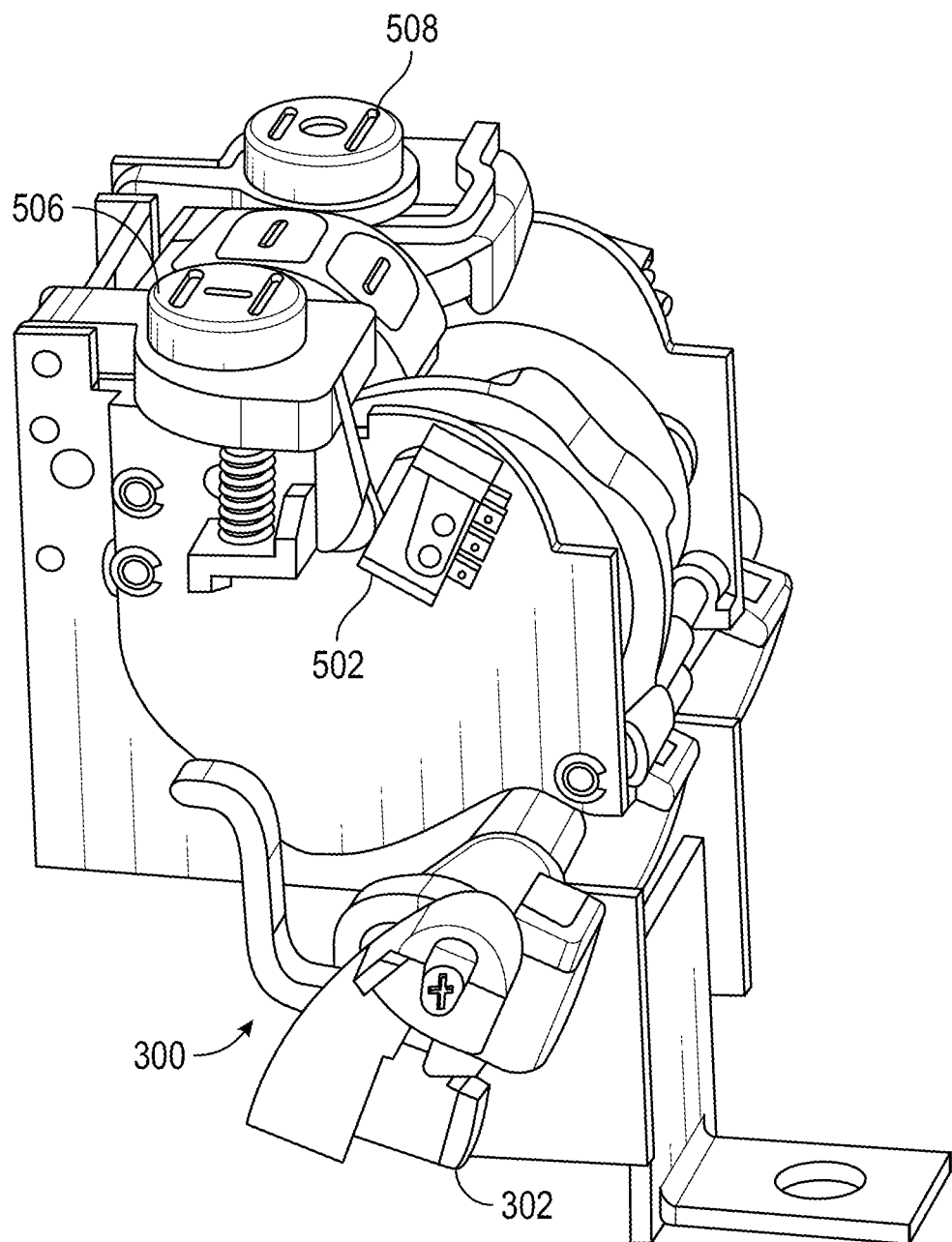
FIGS. 5A and 5B are partial assembly views of a circuit interrupter in accordance with an example embodiment of the disclosed concept.
Figure 5B:
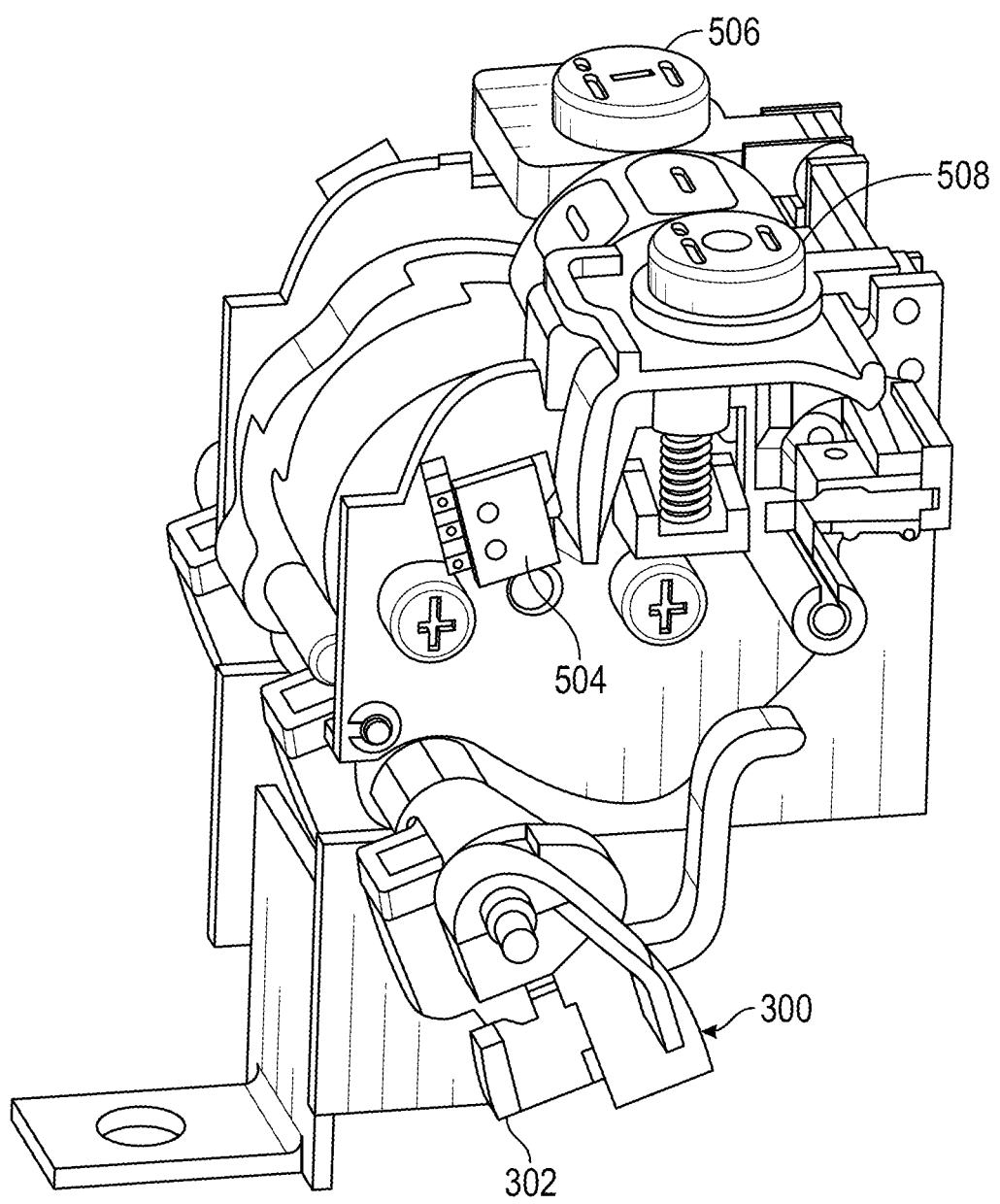

FIGS. 5A and 5B are partial assembly views of the circuit interrupter 10 in accordance with an example embodiment of the disclosed concept. FIGS. 5A and 5B show an example of the close and open buttons 506,508, the position sensors 502,504, part of the operating mechanism 300, and part of the separable contacts 302. In the example shown in FIGS. 5A and 5B, a three pole operating mechanism 300 is shown with movable rotary arms that move the separable contacts 302 in conjunction. The position sensors 502,504 are associated with the close and open buttons 506,508, respectively, such that actuation of the on and off buttons 506,508 causes actuation of the position sensors 502,504. For example, protrusions are attached to the on and off buttons 506,508 and move in conjunction with actuation of the close and open buttons 506,508. As an example, the protrusion associated with the on button 508 may move against the position sensor 504 when the close button 508 is actuated. FIGS. 5A and 5B show part of the separable contacts 302. In particular, FIGS. 5A and 5B show the moveable contact of the separable contacts 302. It will be appreciated that a stationary contact is associated with the moveable contact. Moving the moveable contact away from the stationary contact opens the separable contacts 302.

Figure 6A:
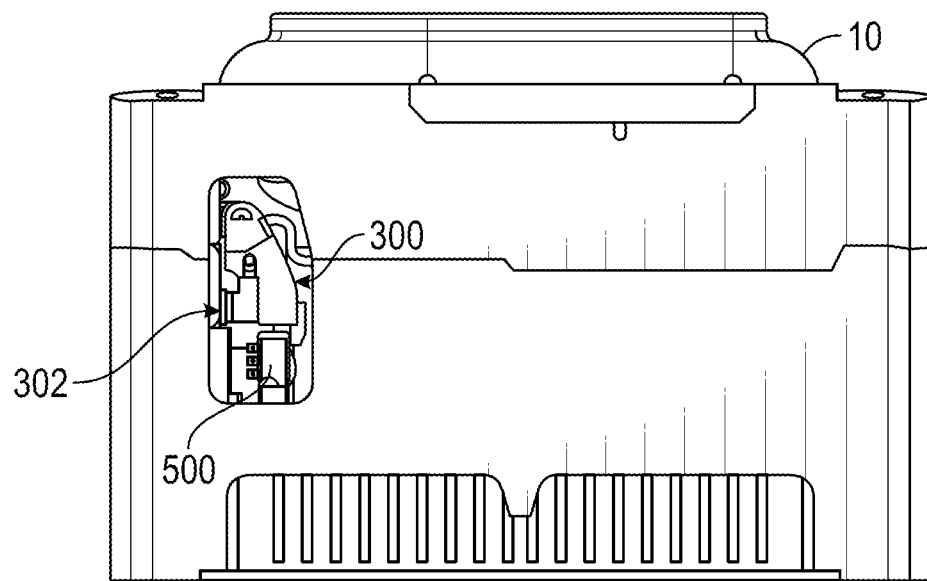
FIGS. 6A and 6B are partial assembly views of a circuit interrupter in accordance with an example embodiment of the disclosed concept.
Figure 6B:
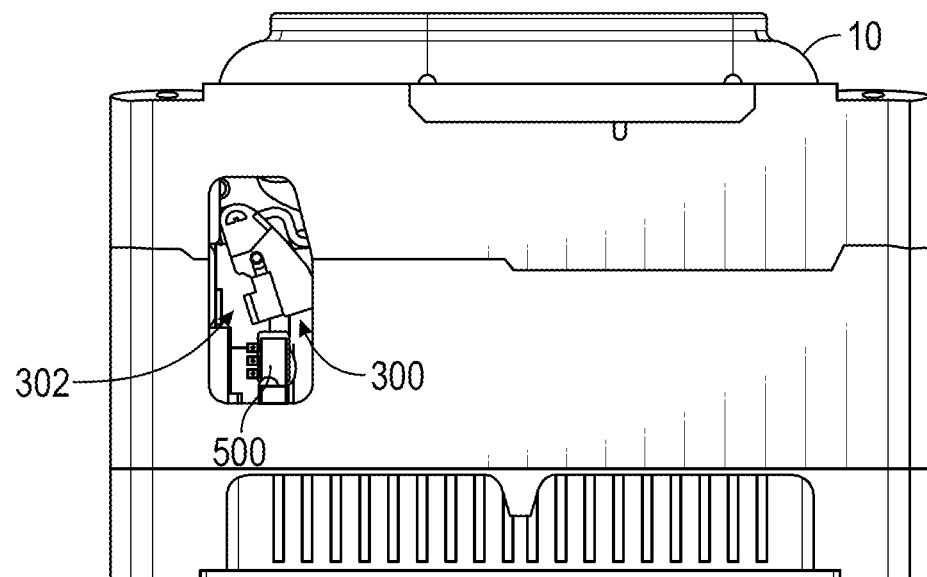

FIGS. 6A and 6B are partial assembly views of the circuit interrupter 10 in accordance with an example embodiment of the disclosed concept. FIG. 6A shows part of the operating mechanism 300 and the separable contacts 302 in the closed position. FIG. 6B shows part of the operating mechanism and the separable contacts 302 in the open position. FIGS. 6A and 6B also show the position sensor 500 which is structured to sense whether the separable contacts 302 are in the closed or open position. The position sensor 500 may be associated with part of a moveable arm of the operating mechanism 300 such that the moveable arm abuts against the position sensor when the separable contacts 302 are in the closed position and moves away from the positon sensor 500 when the separable contacts 302 are in the open position.

Figure 7:
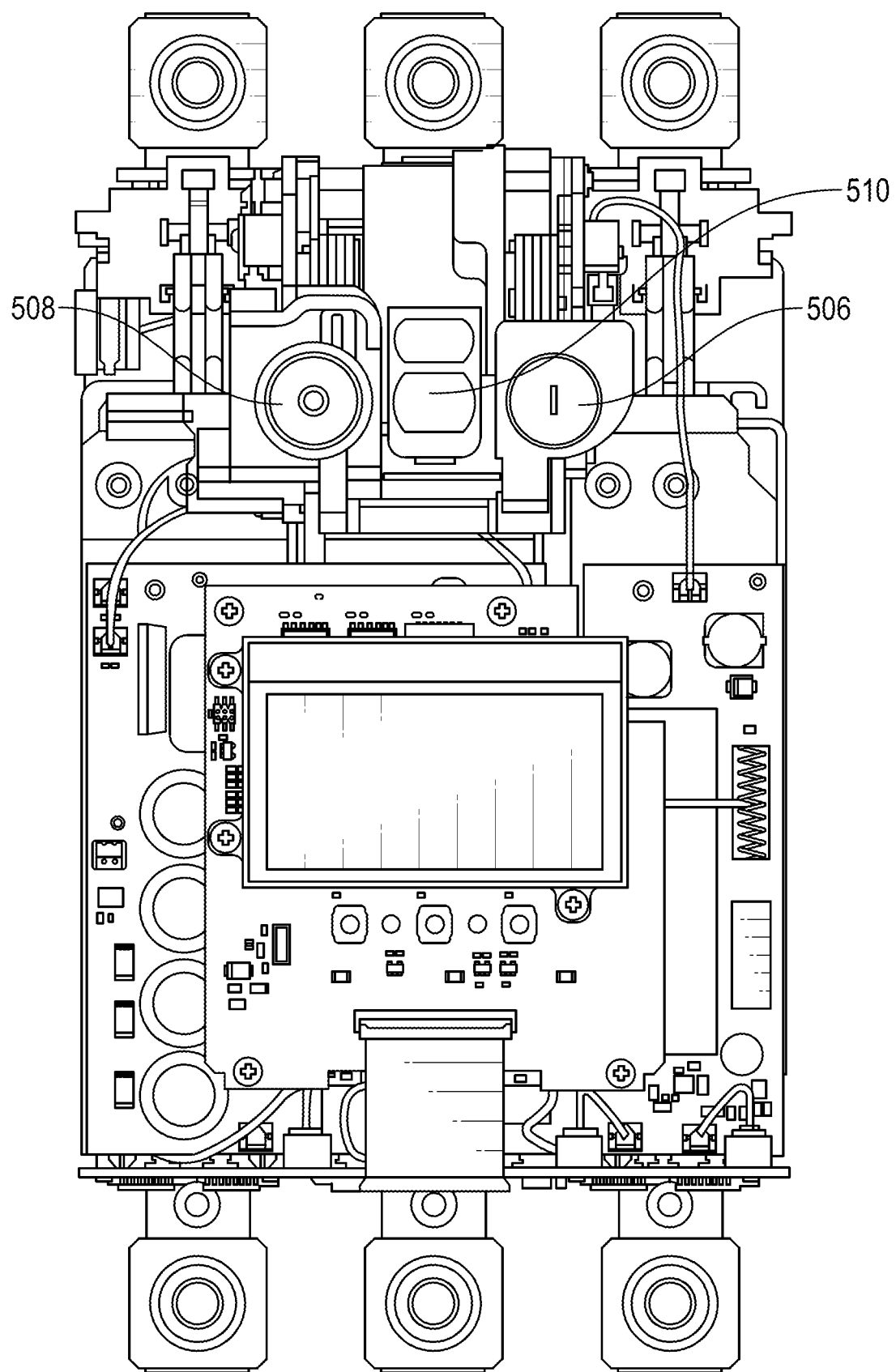
FIG. 7 is a view of a partially disassemble circuit interrupter in accordance with an example embodiment of the disclosed concept.

FIG. 7 is a partially disassembled elevation view of the circuit interrupter 10 in accordance with an example embodiment of the disclosed concept. FIG. 7 shows the close and open buttons 506,508, as well as a status indicator 510 that indicates the position of the separable contacts 302 in accordance with an example embodiment of the disclosed concept.

Figure 8:
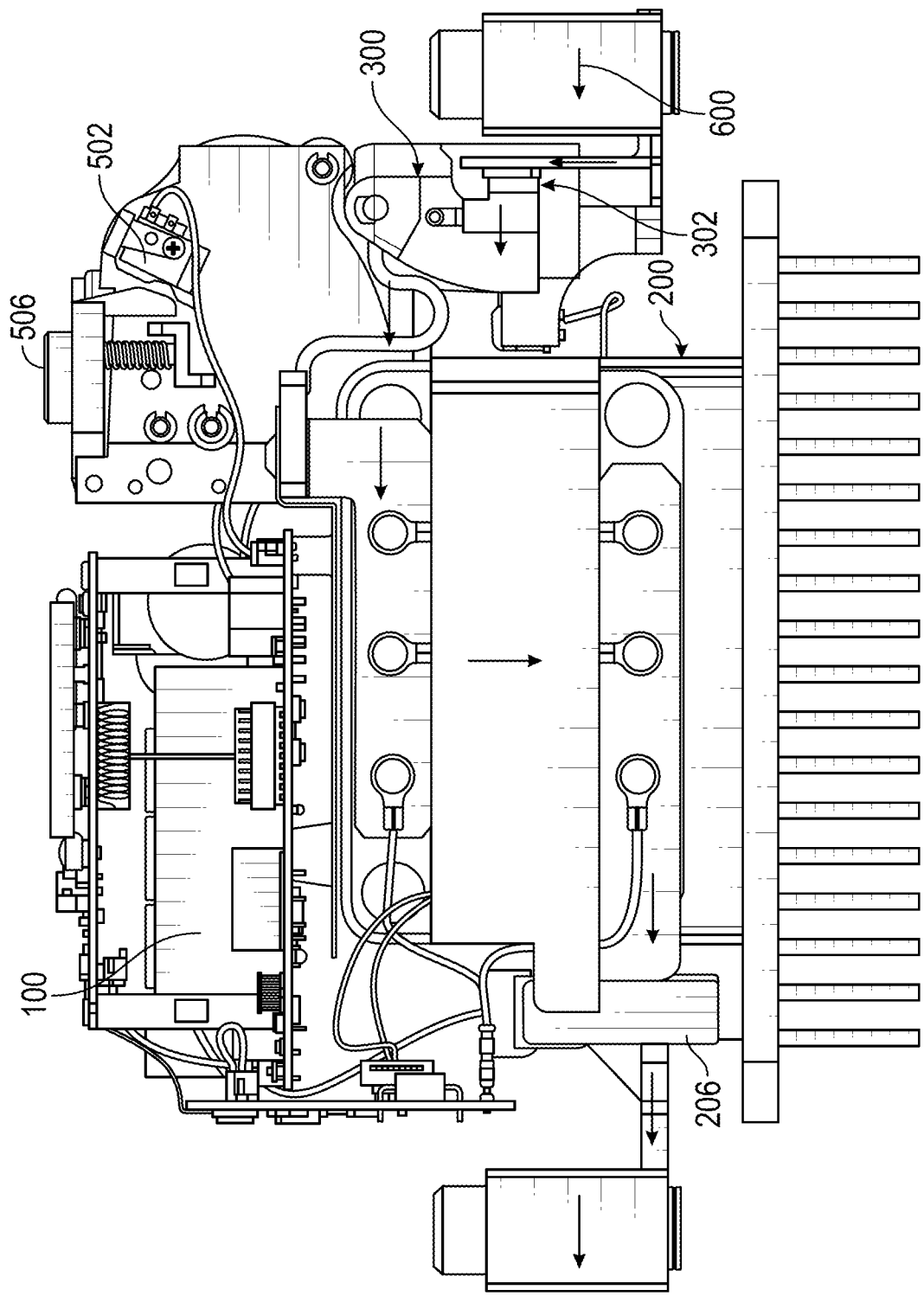
FIG. 8 is a partial internal side view of a circuit interrupter in accordance with an example embodiment of the disclosed concept.

FIG. 8 is a partial internal side view of the circuit interrupter 10 in accordance with an example embodiment of the disclosed concept. A current path 600 through the circuit interrupter is designated with arrows. As shown in FIG. 8, current flowing through the circuit interrupter 10 from the power source 2 first flows through the separable contacts 302. The current then continues through the solid state switch assembly 200 and the current sensor 206 disposed proximate the output of the solid state switch assembly 200, where it is then provided to the load 4.

Figure 9A:
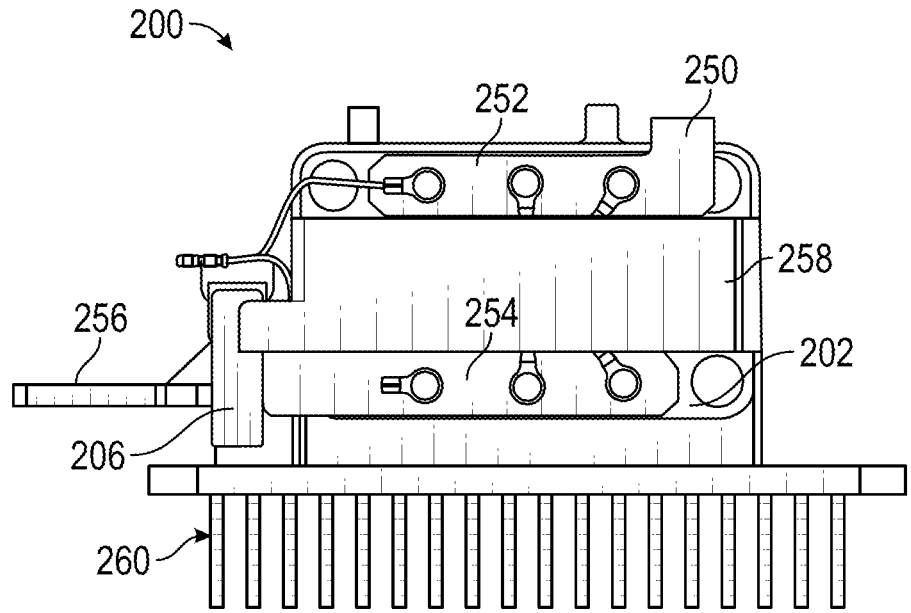
FIGS. 9A-C are views of a solid state switch assembly in accordance with an example embodiment of the disclosed concept.
Figure 9B:
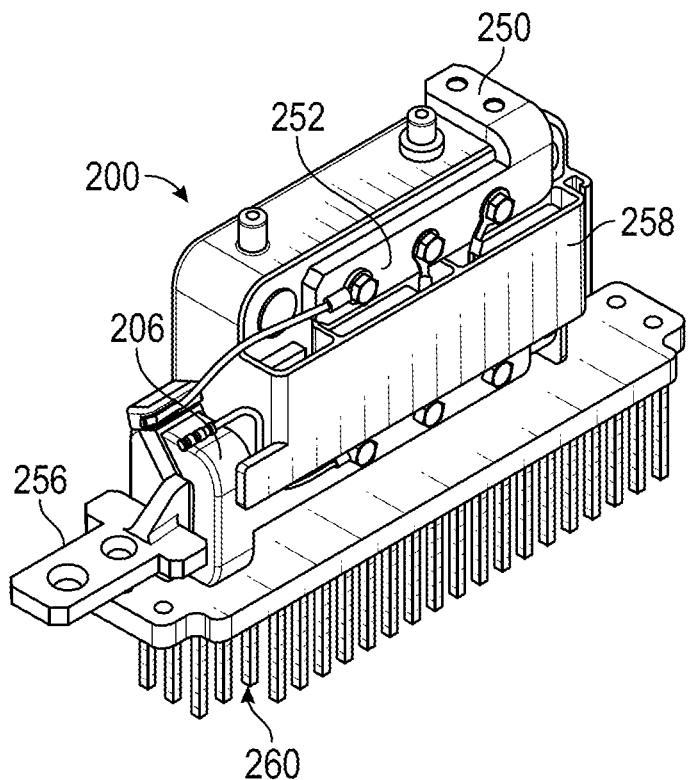
Figure 9C:
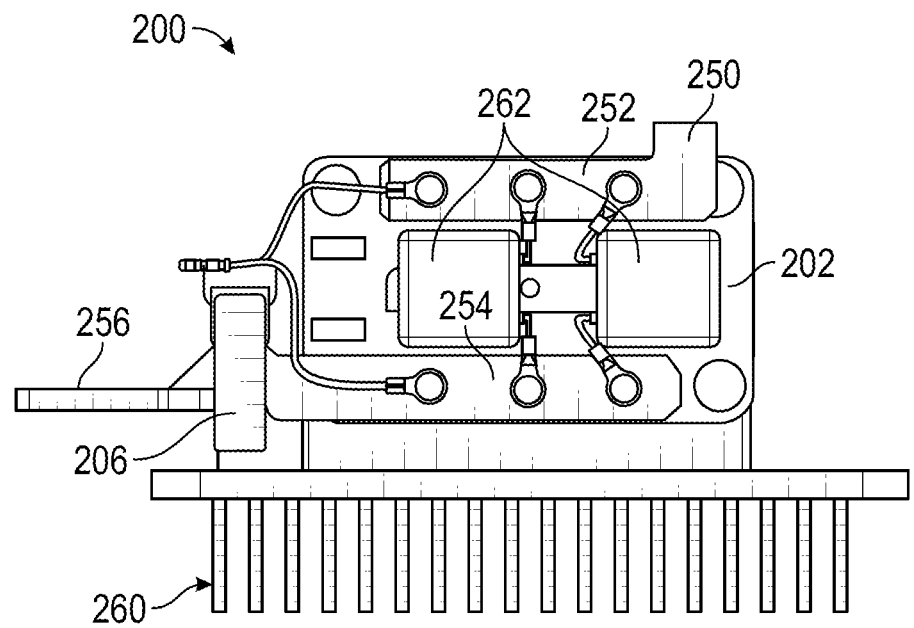

FIGS. 9A-C are views of the solid state switch assembly 200 in accordance with an example embodiment of the disclosed concept. The solid state switch assembly 200 includes the solid state switch module 202 and the current sensor 206. The solid state switch assembly 200 also includes an input terminal 250 and an input conductor 252. The input terminal 250 is structured to receive power from the power source 2 via the separable contacts 302 and provide it to the solid state switch module 202 via the input conductor 252. The solid state switch assembly 200 also includes an output terminal 256 and an output conductor 254. When the solid state switch module 202 is in the closed state, power flows through the solid state switch module 202 to the load conductor 254 and subsequently to the output terminal 256. The output terminal 256 is structured to be electrically connected to the load 4. The solid state switch assembly 200 also includes a module cover 258.

In FIG. 9C, the module cover 258 is omitted. The solid state switch assembly 200 also includes MOVs 262, shown in FIG. 9C, that are covered by the module cover 258.

The solid state switch assembly 200 further includes a heat sink 260. The heat sink 260 is attached to the solid state switch module 200 and is described further with respect to FIGS. 10A-D.

Figure 10A:
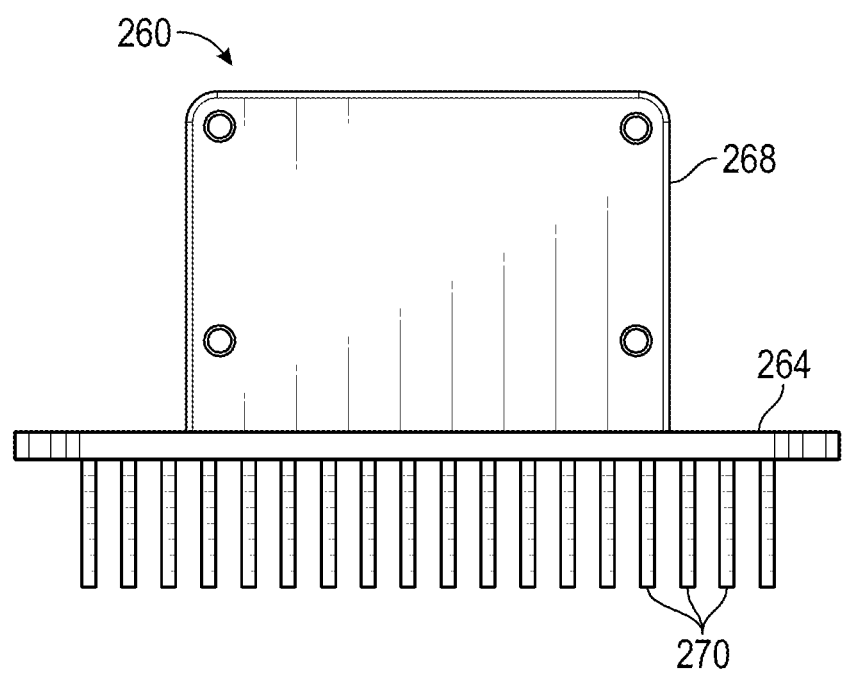
FIGS. 10A-D are views of a heat sink and solid state switch module in accordance with an example embodiment of the disclosed concept.
Figure 10B:
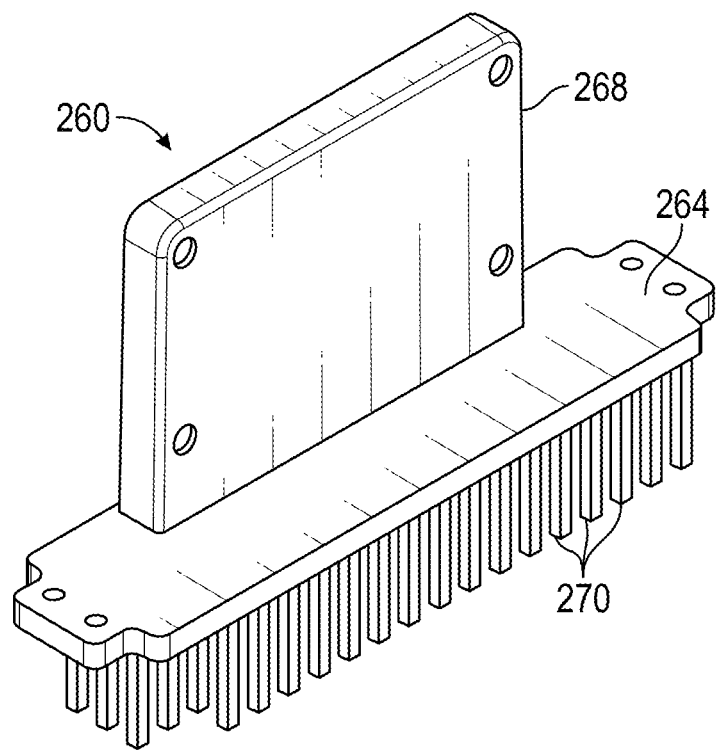
Figure 10C:
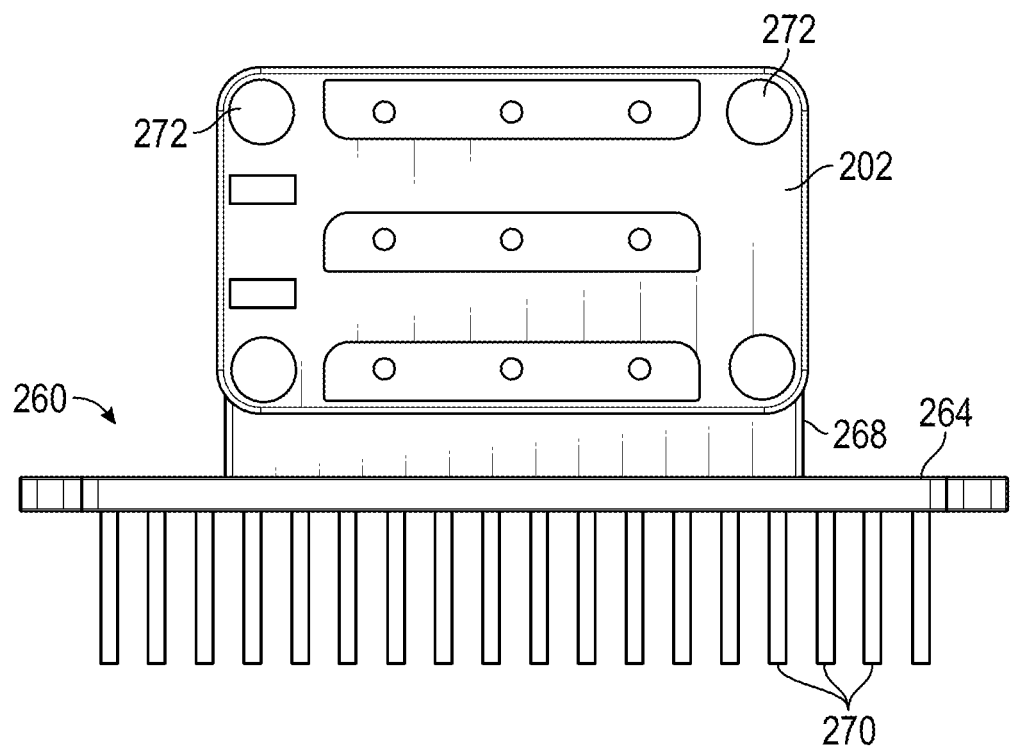
Figure 10D:
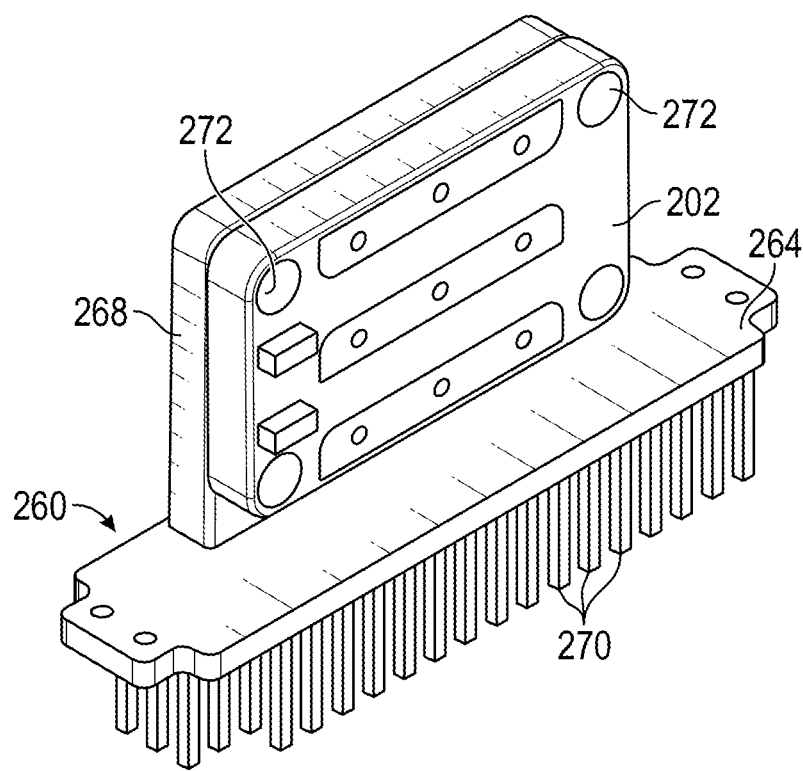

FIGS. 10A and 10B are views of the heat sink 260 in accordance with an example embodiment of the disclosed concept and FIGS. 10C and 10D are views of the solid state switch module 202 attached to the heat sink 260 in accordance with an example embodiment of the disclosed concept. The heat sink 260 includes a first planar member 264 and a second planer member 268 that extends from one side of the first planar member 268. The heat sink 260 also includes multiple prongs 270 that extend from an opposite side of the first planar member 264.

The solid state switch member 202 is structured to attach to the second planar member 268, as shown in FIGS. 10C and 10D. In an example embodiment, fasteners 272 may be used to attach the solid state switch member 202 to the second planar member 268. The heat sink 260 may be composed of a metallic material and is operable to dissipate heat generated by the solid state switch module 202.

Figure 11A:
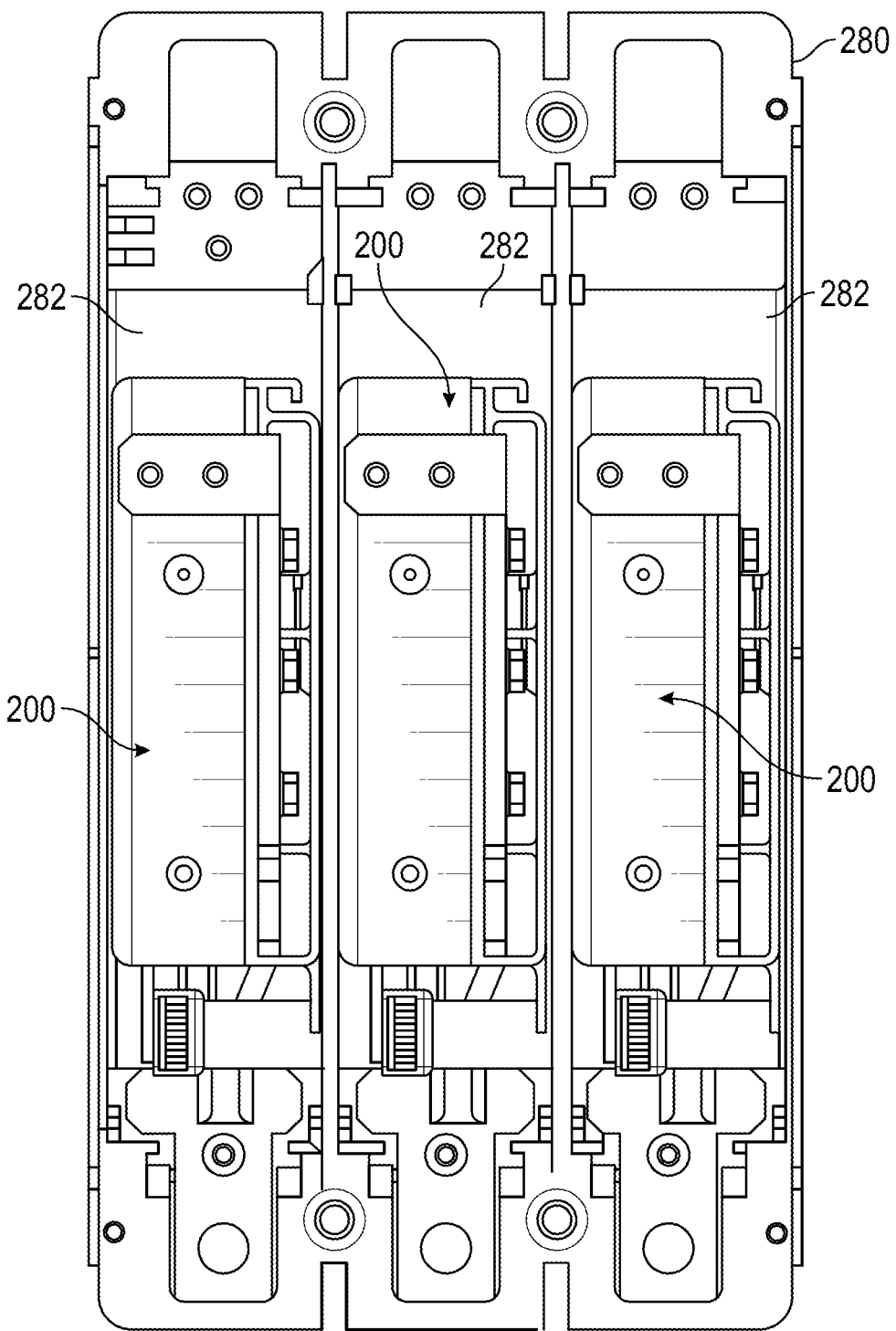
FIGS. 11A-B are views of a frame housing solid state switch assemblies in accordance with an example embodiment of the disclosed concept.
Figure 11B:
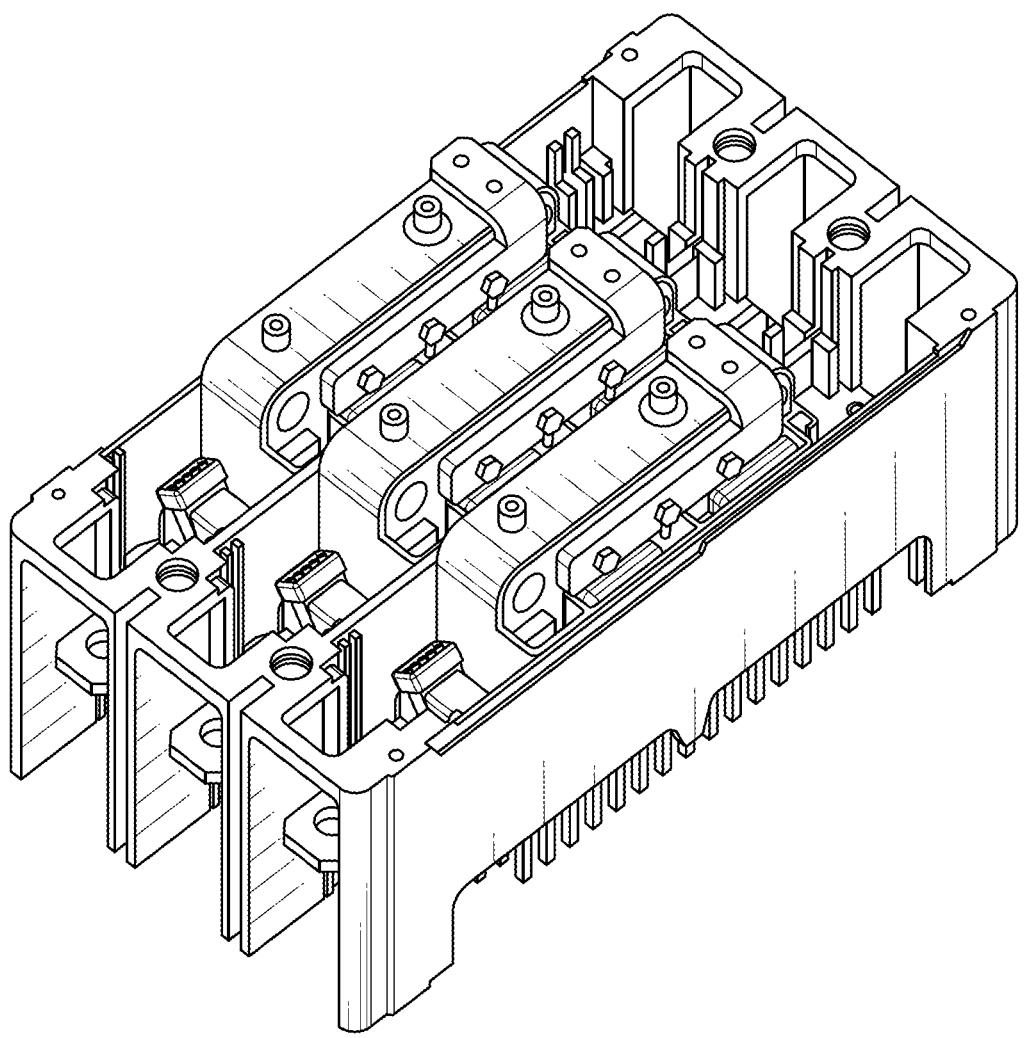

FIGS. 11A and 11B are views of a frame 280 for housing the solid state switch assemblies 200 in accordance with an example embodiment of the disclosed concept. The frame 280 includes compartments 282, each housing one solid state switch assembly 200. In the example embodiment shown in FIGS. 11A and 11B, the frame 280 includes three compartments 282 and houses three solid state switch assemblies 200. Each solid state switch assembly 200 may correspond to a pole of the circuit interrupter 10. The frame 280 is thus suitable for use in a 3-pole circuit interrupter. However, it will be appreciated that the frame 280 may be modified to have a different number of compartments 282 without departing from the scope of the disclosed concept.

The solid state switch assembly 200 has a modular design. Components of the solid state switch assembly 200 may be substituted for other similar shaped components depending on the application of the solid state switch assembly 200. For example, the solid state switch module 202 may be substituted with another solid state switch module 202 for an application with different voltage and current requirements. The remaining components of the solid state switch assembly 200 may remain unchanged, thus allowing a wider application of the solid state switch assembly 200 without the need to redesign the whole solid state switch assembly 200. Similarly, the current sensor 206 may be replaced with another current sensor 206 in applications with different current requirements. Similarly, the other components of the solid state switch assembly 200 may be replaced.

Figure 12:
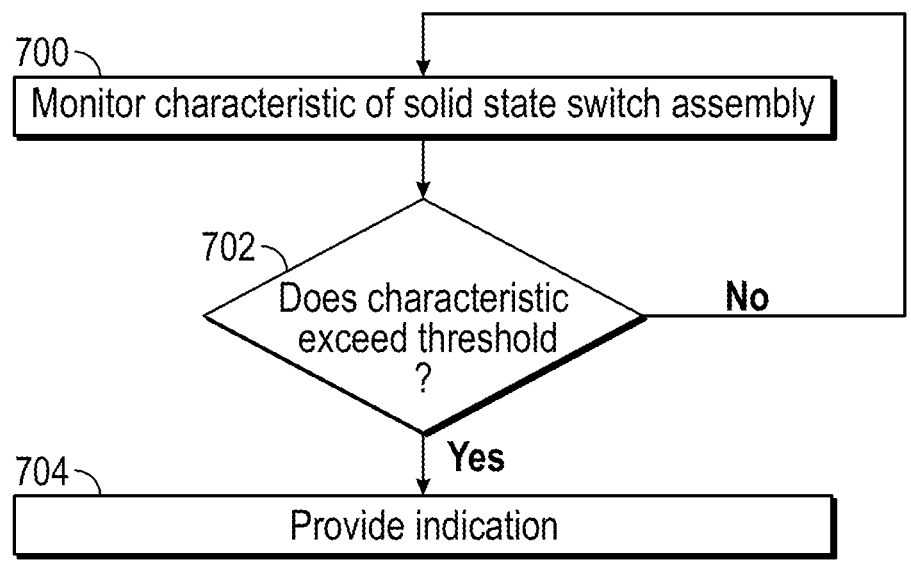
FIG. 12 is a flowchart of a method of operating a circuit interrupter in accordance with an example embodiment of the disclosed concept.

FIG. 12 is a flowchart of a method of operating a circuit interrupter in accordance with an example embodiment of the disclosed concept. The method may be implemented, for example, in the circuit interrupter 10 described herein. Solid state circuit interrupters, such as the circuit interrupter 10, present new concerns regarding health and remaining life compared to mechanical circuit interrupters. For example, monitoring the health of solid state switches differs from monitoring the health of mechanical switches. However, in both cases, it is important to monitor when the switch is reaching the end of its lifespan and becomes at risk of failure.

The method of FIG. 12 begins at 700 with monitoring a characteristic of the solid state switch assembly 200. In some example embodiments, a solid state switch the solid state switch module 202 is monitored. In some example embodiments, the MOVs 262 are monitored. It will be appreciated that both may be monitored. The monitored characteristic may be a junction temperature, a forward volt drop (in the case of an IGBT solid state switch), a body diode forward volt drop (in the case of a MOSFET solid state switch), a gate threshold voltage (in the case of a MOSFET solid state switch), or a gate leakage current (in the case of a MOSFET solid state switch) of the solid state switch. The monitored characteristic may also be a voltage across the MOVs 262.

At 702, it is determined whether the monitored characteristic exceeds a threshold level. The threshold level may be selected based on the monitored characteristic and the device being monitored. In the case of the voltage across the MOVs 262, the threshold may be a time-varying range. For example, the voltage across the MOVs 262 may be monitored for a period of time after the solid state switch is opened. The threshold range changes over the period of time and it is determined whether the voltage across the MOVs 262 goes outside that threshold range at a particular time. If the characteristic does not exceed the threshold level, the method returns to 700. However, if the characteristic exceeds the threshold level, the method proceeds to 704.

At 704, an indication is provided. The indication may be via a display on the circuit interrupter 10 or any other suitable type of indication such as for example, an LED indicator, a wired or wireless communication to an external device, etc. The indication notifies a user or technician that the component needs to be serviced or replaced. It will be appreciated that additional method steps may be employed such as servicing or replacing a component or controlling the circuit interrupter 10 to trip open in response to determining that the monitored characteristic exceeds the threshold level.

The junction temperature is an indicator of the wellness of a solid state switch. As an example, some solid state switches should be kept under a threshold junction temperature of 150 degrees Celsius. If the junction temperature reaches this threshold, then the solid state switch may become damaged and fail. Thus, junction temperature of the solid state switch is a useful characteristic to monitor.

The forward volt drop or body diode forward volt drop are also indicators of the wellness of a solid state switch. When the forward volt drop or body diode forward volt drop reach its threshold when operating at rated current, the solid state switch can become damaged and fail. The forward volt drop or body diode forward volt drop can be caused by a number of factors such as high current, bad heat conduction, or bad thermal management. Thus, the forward volt drop and body diode forward volt drop are useful characteristics to monitor.

The gate threshold voltage or gate leakage current are also useful characteristics of the solid state switch to monitor. The gate threshold voltage or gate leakage current exceeding their threshold levels can damage or cause the solid state switch to fail. The gate leakage current is more sensitive to degradation of the solid state switch and is possible to monitor while the solid state switch is closed and conducting current, which makes it more practical to monitor than the gate threshold voltage. However, both the gate threshold voltage and gate leakage current are useful characteristics to monitor to determine the wellness of the solid state switch.

When the MOVs 262 begin to degrade, the voltage across the MOVs 262 will increase or decrease. The MOVs 262 clamp voltage in a period of time after the solid state switch is opened, and thus this is the relevant time period to monitor the voltage across the MOVs 262. An example threshold range may be ±10% of the MOVs 262 normal clamp voltage. For example, voltage across the MOVs 262 drifting more than 10% from their normal clamp voltage is an indication that the MOVs 262 are degrading and should be serviced or replaced. Thus, the voltage across the MOVs 262 is another useful characteristic to monitor.

While some examples of characteristics to monitor have been described, it will be appreciated that other characteristics may be monitored without departing from the scope of the disclosed concept. It will also be appreciated that additional action in addition to or in place of providing an indication may be performed in response to a characteristic exceeding its threshold.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A circuit interrupter structured to electrically connect between a power source and a load, the circuit interrupter comprising:
   a solid state switch module structured to have a closed state to allow current to flow through the circuit interrupter and an open state to interrupt the current flowing through the circuit interrupter;
   an overcurrent detector structured to detect overcurrent flowing through the circuit interrupter and having an overcurrent detection (OCD) output that changes to an on state upon detection of the overcurrent;
   an analog trip circuit structured to receive the OCD output and to output a first trip signal upon changing of the OCD output to the on state; and
   a gate driver including an enable input structured to receive the first trip signal from the analog trip circuit and a desaturation (DESAT) function output that changes to an on state when the current flowing through the circuit interrupter reaches a threshold current level, wherein the gate driver is structured to cause the solid state switch module to interrupt the current flowing through the circuit interrupter based at least in part on the first trip signal and changing of the DESAT function output to the on state.

2. The circuit interrupter of claim 1, wherein the analog trip circuit outputs the first trip signal based on changing of the OCD output to the on state without comparing the detected overcurrent to a predetermined threshold value.

3. The circuit interrupter of claim 2, wherein the first trip signal is output faster than a trip signal based on a sensor output requiring comparing of sensed current to the predetermined threshold value.

4. The circuit interrupter of claim 2, wherein the analog trip circuit outputs the trip signal within about 10 nanosecond of receiving the OCD output.

5. The circuit interrupter of claim 1, wherein the DESAT function output changes to the on state when forward voltage drop of the solid state switch module reaches a threshold voltage.

6. The circuit interrupter of claim 5, wherein the threshold voltage is reached when the current value is about 2,250 A.

7. The circuit interrupter of claim 6, wherein the gate driver further includes a fault output electrically connected to the electronic trip unit.

8. The circuit interrupter of claim 7 wherein the gate driver is further structured to notify the electronic trip unit when the gate driver has controlled the solid state switch module to change to open or closed state.

9. The circuit interrupter of claim 1, further comprising an electronic trip unit coupled to the enable input of the gate driver and the overcurrent detector.

10. The circuit interrupter of claim 9, wherein the electronic trip unit is structured to output a second trip signal to the enable input based on an I-t trip curve upon detecting a fault condition.

11. The circuit interrupter of claim 10, wherein the interruptions of the current flowing through the circuit interrupter based on the changing of the DESAT function output to the on-state and the first trip signal indicative of the changing of the OCD output to the on-state are faster than the interruption of the current flowing through the circuit interrupter based on the second trip signal received from the electronic trip unit.

12. The circuit interrupter of claim 11, wherein the interruption of the current flowing through the circuit interrupter based on the changing of the DESAT function output to the on state occurs within 0.5 microseconds.

13. The circuit interrupter of claim 11, wherein the interruption of the current flowing through the circuit interrupter based on the first trip signal indicative of the changing of the OCD output to the on state occurs within 2.5 microseconds.

14. The circuit interrupter of claim 11, wherein the interruption of the current flowing through the circuit interrupter based on the second trip signal occurs at least 4 microseconds after the detecting the fault condition.

15. A method of fast tripping of a circuit interrupter including a solid state switch module, an overcurrent detector including an overcurrent detection (OCD) output, an analog trip circuit, an electronic trip unit, and a gate driver including a desaturation (DESAT) function output, comprising:
monitoring a state of at least one of the OCD output and the DESAT function output;
detecting a fault condition based at least in part on the monitored state; and
causing the solid state switch module to interrupt the current flowing through the circuit interrupter based on the detected fault condition, wherein
the detecting the fault condition comprises detecting a change of the DESAT function output into an on state or detecting a change of the OCD output into an on state, and the causing the solid state switch module to interrupt the current flowing through the circuit interrupter comprises the interruption of the current within 0.5 microseconds, the fault condition being based on the change of the DESAT function output.

16. A method of fast tripping of a circuit interrupter including a solid state switch module, an overcurrent detector including an overcurrent detection (OCD) output, an analog trip circuit, an electronic trip unit, and a gate driver including a desaturation (DESAT) function output, comprising:
monitoring a state of at least one of the OCD output and the DESAT function output;
detecting a fault condition based at least in part on the monitored state; and
causing the solid state switch module to interrupt the current flowing through the circuit interrupter based on the detected fault condition, wherein
the detecting the fault condition comprises detecting a change of the DESAT function output into an on state or detecting a change of the OCD output into an on state, the fault condition is based on the change of the OCD output, and the causing the solid state switch module to interrupt the current flowing through the circuit interrupter comprises the interruption of the current within 2.5 microseconds.

17. A method of fast tripping of a circuit interrupter including a solid state switch module, an overcurrent detector including an overcurrent detection (OCD) output, an analog trip circuit, an electronic trip unit, and a gate driver including a desaturation (DESAT) function output, comprising:
monitoring a state of at least one of the OCD output and the DESAT function output;
detecting a fault condition based at least in part on the monitored state; and
causing the solid state switch module to interrupt the current flowing through the circuit interrupter based on the detected fault condition, wherein
the detecting the fault condition comprises detecting a change of the DESAT function output into an on state or detecting a change of the OCD output into an on state, the detecting the fault condition is based on an I-t trip curve and the electronic trip unit outputs a trip signal to the gate driver based on the I-t trip curve.

18. The method of claim 17, wherein causing the solid state switch module to interrupt the current flowing through the circuit interrupter comprises the interruption of the current at least more than 4 microseconds after the detecting the fault condition based on the I-t trip curve.

* * * * *